(12) United States Patent
Pang et al.

(10) Patent No.: US 6,517,634 B2
(45) Date of Patent: Feb. 11, 2003

(54) CHEMICAL VAPOR DEPOSITION CHAMBER LID ASSEMBLY

(75) Inventors: Lily L. Pang, Fremont, CA (US); Thomas K. Cho, Palo Alto, CA (US); Tetsuya Ishikawa, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 57 days.

(21) Appl. No.: 09/797,161

(22) Filed: Feb. 28, 2001

(65) Prior Publication Data

US 2002/0117262 A1 Aug. 29, 2002

Related U.S. Application Data

(60) Provisional application No. 60/185,283, filed on Feb. 28, 2000.

(51) Int. Cl.[7] .............................................. C23C 16/000
(52) U.S. Cl. ........................ 118/715; 16/235; 16/239; 16/241; 49/254; 49/257; 49/258
(58) Field of Search .................... 16/239, 235, 241; 118/715; 220/810–811, 816–826; 49/254, 257, 258

(56) References Cited

U.S. PATENT DOCUMENTS

| | | | | |
|---|---|---|---|---|
| 1,101,521 A | * | 6/1914 | Bram | |
| 1,181,403 A | * | 5/1916 | Norton | |
| 3,593,365 A | * | 7/1971 | Amundsen | 16/169 |
| 4,839,941 A | * | 6/1989 | Orlando | 16/361 |
| 5,068,765 A | * | 11/1991 | Nimpoeno | 361/422 |
| 5,350,479 A | | 9/1994 | Collins et al. | 156/345 |
| 5,784,749 A | * | 7/1998 | Garbacik, Jr. et al. | 15/250.02 |
| 5,873,149 A | * | 2/1999 | Bononberger | 16/366 |
| 6,009,667 A | * | 1/2000 | Mizukami | 49/153 |
| 6,047,445 A | * | 4/2000 | Mennen | 16/374 |
| 6,050,446 A | | 4/2000 | Lei et al. | 220/819 |
| 6,273,955 B1 | * | 8/2001 | Yoshino et al. | 118/718 |

FOREIGN PATENT DOCUMENTS

GB 2 264 105 A * 8/1993 ........... B65D/43/16

OTHER PUBLICATIONS

Pang et al. "Apparatus for Cleaning a Semiconductor Process Chamber" U.S. patent application Ser. No. 09/721,060, filed Nov. 21, 2000.

* cited by examiner

*Primary Examiner*—Gregory Mills
*Assistant Examiner*—Karla Moore
(74) *Attorney, Agent, or Firm*—Moser, Patterson & Sheridan

(57) ABSTRACT

A semiconductor substrate processing chamber is disclosed generally comprising a chamber body that has a semiconductor substrate support assembly disposed in the chamber body. A lid assembly is movably coupled to the chamber body via a dual pivot hinge assembly. The hinge assembly provides two pivot points that minimize the abrasion and pinching of an o-ring disposed between the lid assembly and the chamber body upon closing of the lid assembly.

33 Claims, 6 Drawing Sheets

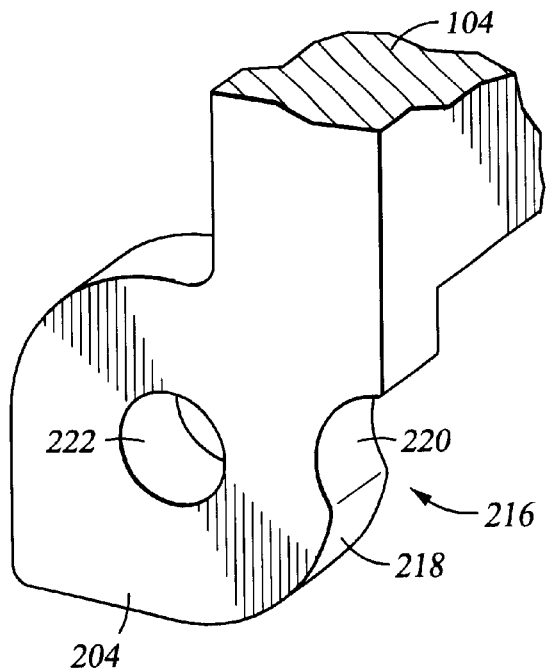
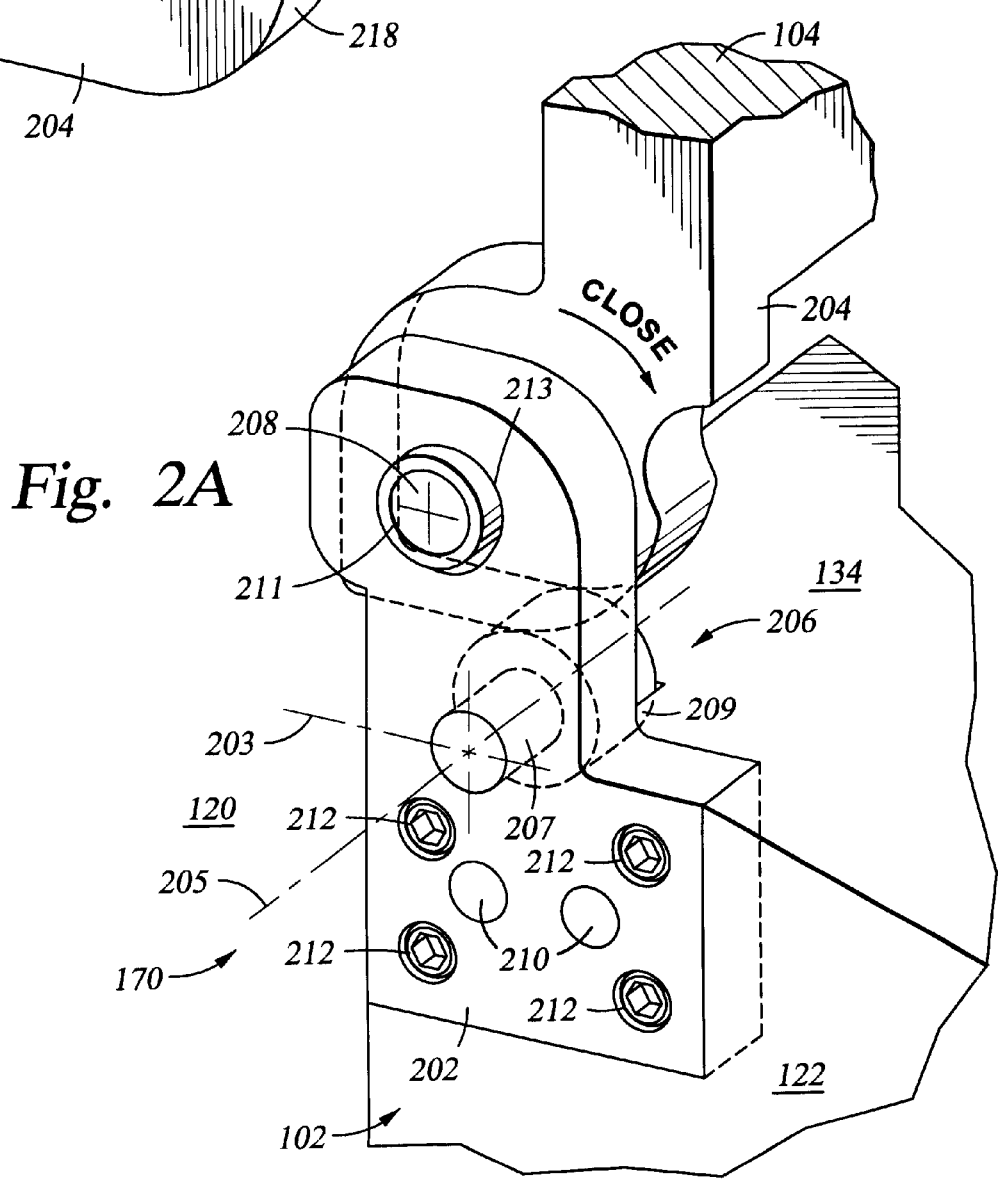

CHEMICAL VAPOR DEPOSITION CHAMBER LID ASSEMBLY

CROSS REFERENCE TO RELATED APPLICATIONS

This application claims benefit of U.S. Provisional Application No. 60/185,283, filed Feb. 28, 2000.

BACKGROUND OF THE DISCLOSURE

1. Field of Invention

The present invention relates generally to apparatus for processing semiconductor wafers. More specifically, the invention relates to a lid assembly of a process chamber used for depositing material on a semiconductor wafer during a chemical vapor deposition process.

2. Description of the Background Art

Integrated circuits have evolved into complex devices that include millions of transistors, capacitors and resistors on a single chip. The evolution of chip designs continually requires faster circuitry and greater circuit density. As the demand for integrated circuits continues to rise, chip manufactures have demanded semiconductor process tooling having increased wafer throughput and greater product yield. To meet this increase in throughput, tooling is being developed to process wider diameter wafers, for example, wafers having diameters of 300 millimeters (mm).

Processing chambers generally capable of processing 300 mm diameter wafers typically have greater dimensions and internal volume than chambers designed to process smaller diameter wafers. The greater chamber dimensions correspondingly require a lid assembly disposed over the chamber to seal a vacuum environment as well as providing maintenance access.

The lids for the process chambers are connected to the chamber by a hinge and are opened during down times to perform maintenance on the process chambers. Therefore, an interface between the lid and the process chamber must include a seal, such as an o-ring, to maintain the vacuum in the process chamber and to prevent the gases used in the process from leaking into the environment. Further, when the lid is closed, it must be properly positioned on the process chamber to align the chamber components in the lid (e.g., a gas manifold in a CVD chamber) to the other process chamber components, such as the support member and a substrate positioned thereon. One observed problem is degradation in the o-ring that forms the seal. In particular, as the lid is rotated into a closed position, the lid unevenly contacts the o-ring seal beginning with the back of the chamber and then continuing to the front of the chamber until the lid is fully closed. As such, the o-ring has been subjected to pinching, nicking, and abrasion between the lid and top surface of the chamber.

One possible solution to overcome the deterioration of the seal is found in commonly owned and assigned U.S. Pat. No. 6,050,446, issued Apr. 18, 2000, to Applied Materials Inc., of Santa Clara, Calif. This prior art patent discloses a process chamber having a pivoting lid assembly that allows the lid to float above the process chamber before the lid is secured to the chamber. In particular, the lid assembly includes a lid support frame rotatably coupled to the back of the chamber by a plurality of hinges. In addition, the lid is pivotally connected to the lid support frame, preferably near the center of mass of the lid to form a pivot connection. In this manner, the lid can be positioned in parallel alignment relative to the chamber before being lowered onto the chamber and can be aligned with the chamber before being secured thereon.

Other solutions include adding a piston between the lid assembly and the body of the chamber to reduce the force of the lid as the lid closes upon the o-ring. However, there is a need in the art for an improved lid assembly that does not subject the o-ring seal to abusive forces caused by the weight and trajectory of the lid during opening and closing thereof.

SUMMARY OF INVENTION

The disadvantages associated with the prior art are overcome by the present invention of semiconductor substrate processing system. The semiconductor processing system generally comprises a chamber body that has a semiconductor substrate support assembly disposed in the chamber body. A lid assembly is movably coupled to the chamber body via a dual pivot hinge assembly. The hinge assembly provides two pivot points that minimize the abrasion and pinching of an o-ring disposed between the lid assembly and the chamber body upon closing of the lid assembly.

In one embodiment, a hinge assembly comprises a hinge block, a cam plate, a cam follower, and a shaft. The hinge block is coupled to the chamber body. The hinge block includes a mounting portion and a tab that projects from the mounting portion above a first surface of the chamber body. The mounting portion is disposed in a slot formed in a sidewall of the chamber body. The hinge block additionally includes a hole that generally has its centerline in the plane defined by the first surface. The hole partially houses the cam follower. The cam follower is a cylindrical member having at least a portion protruding from the hinge block. A conforming recess extending from the slot into the chamber body along the first surface accommodates the portion of the cam follower projecting from the hinge block that lies below the first surface. The tab includes an aperture. The aperture is sized to allow the shaft to move both rotationally and translationally within the aperture. The cam plate has a hole in which the shaft is partially disposed. The shaft is retained in the hole by a press fit.

The cam plate has a contoured surface that has a first portion and a second portion. The first portion is disposed at a radial distance from the aperture such that the center of rotation (i.e., a first inner pivot point) of the lid assembly has a first range of motion from an open position to a nearly closed position about the shaft and confined within the area defined by the aperture. When the lid assembly moves from the nearly closed position to a closed position to define a second range of motion (i.e., through about 5 degrees relative the first surface), the second portion of the contoured surface makes contact with the cam follower. Accordingly, the center of rotation of the lid assembly changes from the area defined by the aperture in the hinge block to the center of the cam follower (i.e., a second outer pivot point).

In a second embodiment of the first hinge assembly, the cam plate extends from the chamber body. Specifically, a hinge block is attached to the chamber body and comprises a contoured edge for interfacing with a cam follower extending from a side of a lid assembly. The contoured edge serves as a cam plate. Furthermore, the hinge block comprises an aperture for receiving a shaft coupled to the lid assembly a distance from the cam follower. The aperture is sized larger than the diameter of the shaft thereby allowing for rotational and translational motion.

When the lid assembly is in an open position, a center of rotation (i.e., a first inner pivot point) of the lid assembly has a first range of motion from an open position to a nearly closed position about the shaft and confined within the area defined by the aperture. When the lid assembly moves from the nearly closed position to a closed position to define a second range of motion (i.e., through about 5 degrees relative the first surface), the contoured edge makes contact with the cam follower. Accordingly, the center of rotation of the lid assembly changes from the area defined by the aperture to the center of the cam follower (i.e., a second outer pivot point).

In a third embodiment of the hinge assembly, a first surface of a chamber body comprises a projection that serves as a cam plate. Additionally, a hinge block is attached to the chamber body and comprises an aperture for receiving a shaft coupled to a lid assembly. The aperture is larger than the diameter of the shaft, thereby allowing for rotational and translational motion. The lid assembly further comprises a depression or contoured surface area on a lower surface area of the lid assembly. The contoured surface interfaces with the cam plate and serves as a cam follower. The cam plate is spaced at a predetermined distance from the shaft of the lid assembly.

When the lid assembly is in an open position, a center of rotation (i.e., a first inner pivot point) of the lid assembly has a first range of motion from an open position to a nearly closed position about the shaft and confined within the area defined by the aperture. When the lid assembly moves from the nearly closed position to a closed position to define a second range of motion (i.e., through about 5 degrees relative the first surface), the contoured surface area on a lower surface area of the lid assembly (i.e., cam follower) makes contact with the cam plate. Accordingly, the center of rotation of the lid assembly changes from the area defined by the aperture to the center of the cam follower (i.e., a second outer pivot point).

Coinciding with the hinge assembly of each of the embodiments is a second hinge assembly is disposed on the other side of the lid assembly allowing the rotation of the lid assembly to be defined by the first hinge assembly. The dual pivot action of the first hinge assembly allows the lid assembly to remain clear of the processing platform using the first inner pivot point defined by the aperture. The second outer pivot point defined by the cam follower seats the lid assembly with a substantially normal motion relative the o-ring, thus minimizing abrasion and "pinching" of the o-ring upon closing the lid assembly.

BRIEF DESCRIPTION OF DRAWINGS

The teachings of the present invention can be readily understood by considering the following detailed description in conjunction with the accompanying drawings, in which:

FIG. 2A depicts a perspective view of a first embodiment of a hinge assembly of the processing system of FIG. 1;

FIG. 2B depicts a perspective view of a cam plate of the hinge assembly of FIG. 2A;

To facilitate understanding, identical reference numerals have been used, where possible, to designate identical element that are common to the figures.

DETAIL DESCRIPTION OF INVENTION

The present invention generally provides an apparatus for processing a semiconductor substrate. The invention is illustratively described below as a chemical vapor deposition system, such as an ULTIMA® High Density Plasma Chemical Vapor Deposition (HDP-CVD) chamber system, available from Applied Materials, Inc. of Santa Clara, Calif. However, it should be understood that the invention may be incorporated into other chamber configurations such as physical vapor deposition chambers, etch chambers, ion implant chambers, and other semiconductor processing chambers.

Figure 1:
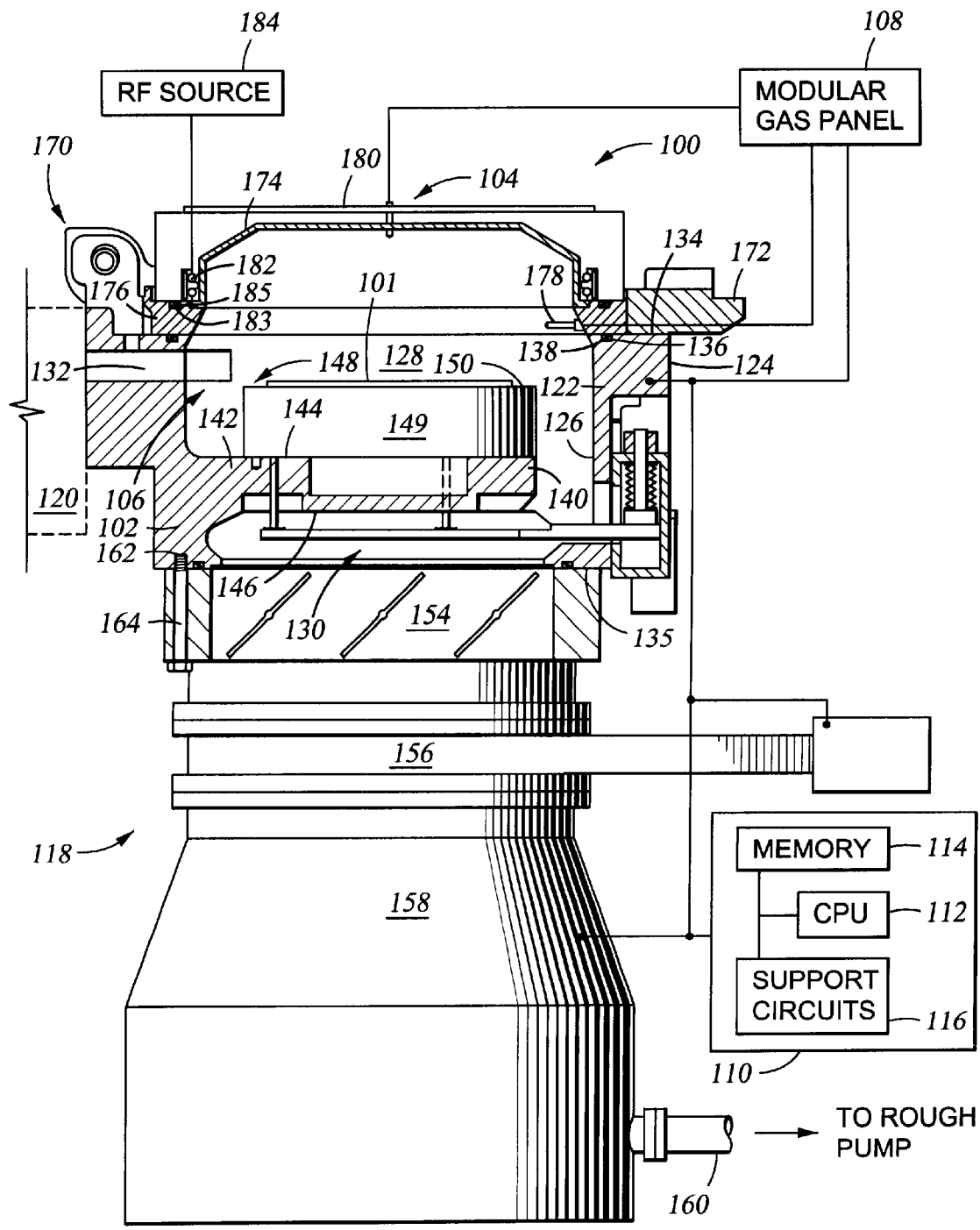
FIG. 1 depicts a partial cross section of a semiconductor processing system of the present invention.

FIG. 1 depicts an illustrative HDP-CVD chamber system (system) 100 that generally comprises a chamber body 102 and a lid assembly 104 that defines an evacuable chamber 106 for carrying out substrate processing. The system 100 may be one of a number of substrate processing systems that are coupled to a processing platform 120 such as a CENTURA® processing platform, available from Applied Materials, Inc. The system 100 includes a pumping stack 118, a modular gas panel 108 and a controller 110. The controller 110 has a central processing unit (CPU) 112, a memory 114, and support circuits 116. The controller 110 is coupled to the various components of the system 100 to facilitate control of the deposition process.

Referring to FIG. 1, the chamber body 102 is typically a unitary, machined structure fabricated from a rigid block of material such as aluminum. The chamber body 102 has a plurality of sidewalls 122 having a substantially rectangular outside surface 124 and an annular, inner surface 126 that defines a processing region 128. The annular, inner surface 126 defining processing region 128 generally tapers to define an exhaust passage 130. Furthermore, at least one sidewall 122 is electrically grounded. The chamber body 102 contains a substrate entry port 132 that is selectively sealed by a slit valve (not shown) disposed in the processing platform 120.

A substrate support platform 140 is coupled to the sidewall 122 by one or more support arms. The support platform 140 comprises a first surface 144 for supporting a support assembly 148 and a second surface 146 that faces the exhaust passage 130. The substrate support assembly 148 is disposed on the first surface 144 of the support platform. The substrate support assembly 148 generally comprises a substrate support 150 and a base 149. The substrate support 150 may be a susceptor, a heater, ceramic body, or electrostatic chuck on which the substrate or wafer 101 is placed during processing. For a detailed understanding of an electrostatic chuck and its operation in processing the wafer, the reader should refer to the drawings and the detailed description in commonly assigned U.S. Pat. No. 5,350,479, issued Sep. 27, 1994, and incorporated herein by reference. That patent teaches an electrostatic chuck manufactured by Applied Materials, Inc. of Santa Clara, Calif.

Referring to FIG. 1, a first surface 134 of the chamber body 102 defines a generally flat landing area on which the lid assembly 104 is supported. An o-ring groove 136 is formed in the first surface 134 of the sidewall 122 to receive an o-ring 138 that forms a gas-tight seal between the chamber body 102 and the lid assembly 104. Typically, the o-ring 138 is fabricated from a fluoropolymer or other materials compatible with the processing environment, such as CHEMREZ™.

To minimize the generation of particulates caused by the interaction of the lid assembly 104 and o-ring 138 upon closing, a pair of dual pivot, hinge assemblies (a first hinge assembly 170 is shown) operably couples the lid assembly 104 to the chamber body 102. The hinge assemblies provide a dual pivot point that seats the lid assembly 104 on the o-ring 138 with minimal shear and abrasion or "pinching" of the o-ring 138.

Figure 5:
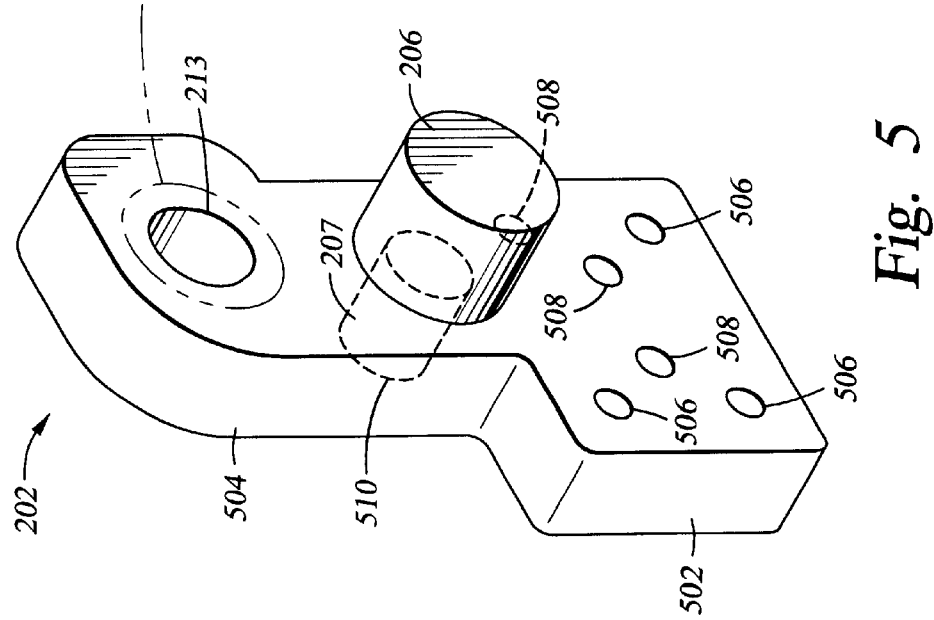
FIG. 5 depicts a perspective view of a hinge block of the hinge assembly of FIG. 2A.
Figure 6:
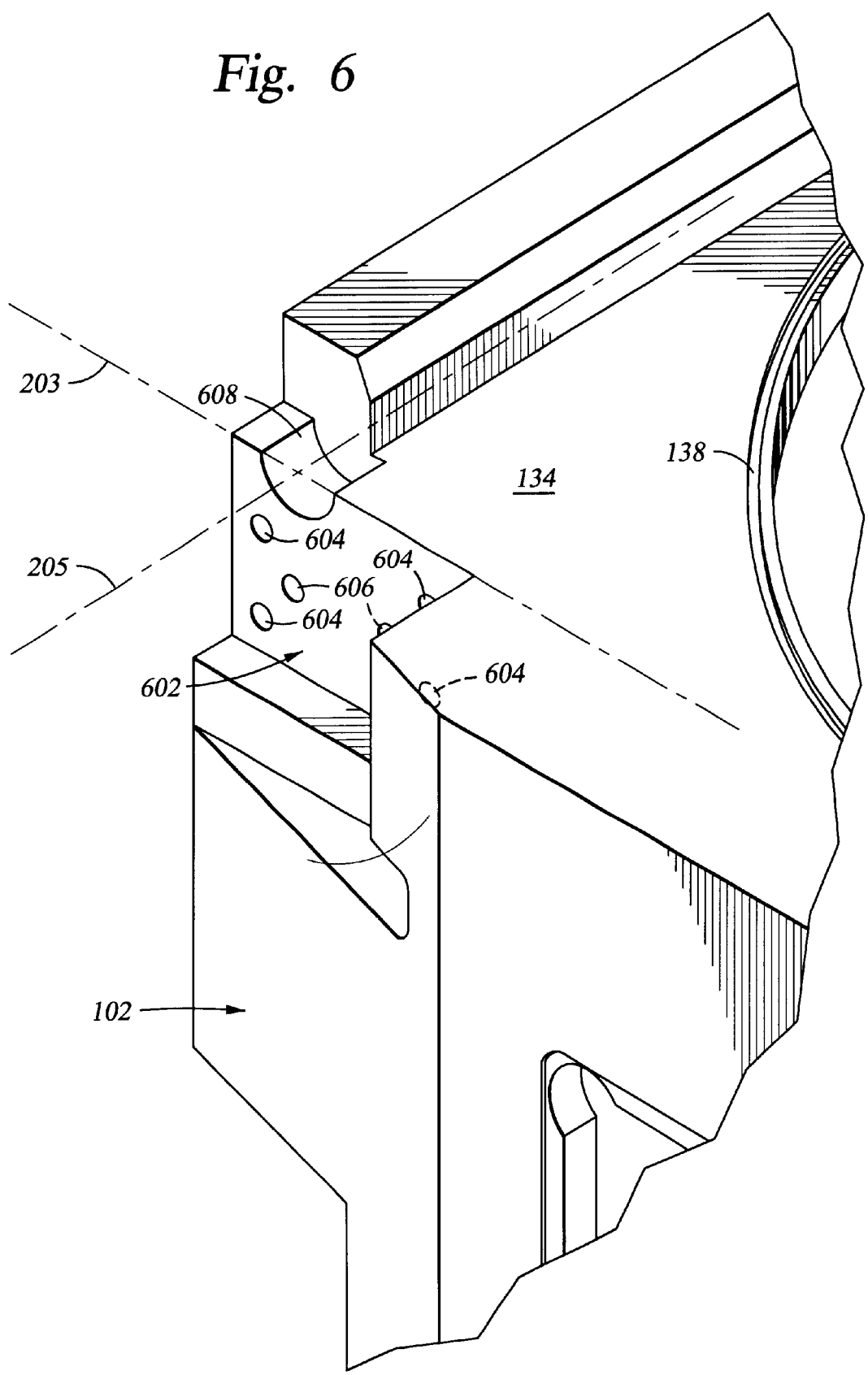
FIG. 6 depicts a partial perspective view of a chamber body having a slot in the processing system of FIG. 1.

FIG. 2A, 2B, and 5 depict one embodiment of the first hinge assembly 170. FIG. 6 depicts a slot 602 in the chamber body 102 to which the first hinge assembly 170 is mounted. The reader is encouraged to refer to FIGS. 2A, 2B, 5, and 6 together to best understand the hinge assembly 170 described in the paragraphs that follow.

The first hinge assembly 170 comprises a hinge block 202, a cam plate 204, a cam follower 206, and a shaft 208. Generally, the hinge block 202 is coupled to the chamber body 102. The hinge block 202 is fabricated from a material of sufficient strength and rigidity to support the weight of the lid assembly 104 through both the open and closed positions. In one embodiment, the hinge block 202 is aluminum. Referring to FIG. 5 the hinge block 202 includes a mounting portion 502 and a tab 504 that projects from the mounting portion 502 above the first surface 134 of the chamber body 102. The mounting portion 502 has a plurality of mounting holes 506 and a plurality of dowel holes 508. Preferably, 4 mounting holes 506 and at least two dowel holes 508 are utilized.

The mounting portion 502 is disposed in a slot 602 (see FIG. 6) formed in the sidewall 122 of the chamber body 102. The slot 602 generally has a plurality of threaded mounting holes 604 and location holes 606, which align with the mounting holes 506 and the dowel holes 508 respectively. Dowel pins 210 pass through the dowel holes 508 of the hinge block 202 and mate with the corresponding location holes 606, thereby orientating the hinge block 202 in a predetermined position relative the chamber body 102. A plurality of mounting bolts 212 (e.g., 4 mounting bolts) pass through the mounting holes 506 and into the threaded holes 604, fastening the hinge block 202 to the chamber body 102. Alternatively, the hinge block 202 may be fastened by other means such as rivets, welding and the like, or optionally, fabricated as a unitary part of the chamber body 102.

The hinge block 202 additionally includes a hole 510 that generally has its centerline 205 in the plane 203 defined by the first surface 134. The hole 510 partially houses the cam follower 206. The cam follower 206 comprises a cam portion 209 having a shaft 207 extending perpendicularly from the center of the cam 209. The cam follower 206 generally comprises a bearing, or shaft material, such as steel. Alternatively, the cam follower 206 may comprise a roller bearing. The shaft 207 extends through the hole 510 in the hinge block 202 to secure the cam follower 206. In one embodiment, the shaft 207 is threaded whereby a nut (not shown) is torqued thereon. Other techniques of securing the shaft 207 of the cam follower 206 include press fitting the shaft 207 into the hole 510, screwing the cam follower shaft 207 into a threaded hole 510, or any other technique that will rigidly secure the cam follower 206 to the hinge block 202.

A conforming recess 608 extends from the slot 602 into the chamber body 102 along the first surface 134. The conforming recess 608 accommodates the cam portion 209 of the cam follower 206 once the hinge block 202 and cam follower 206 are secured to the slot 602 formed in the sidewall 122 of the chamber body 102. Preferably, the center of the cylindrical cam follower 206 is co-planar to the surface 134 of the chamber body 102. Furthermore, the cam follower 206 and the hinge block 202 may be formed as one piece of hardware. Moreover, in an alternate embodiment (not shown), the cam follower 206 extends from the sidewall 122 of the chamber body 102. Specifically, the cam follower 206 is integral of the sidewall 122 and disposed where the conforming recess 608 is along the first surface 134.

Referring to FIG. 5, the tab 504 includes an aperture 213. The aperture 213 is sized larger than the shaft 208 to allow the shaft 208 to move both rotationally and translationally within the aperture 213. Preferably, a sleeve 211 is disposed over the shaft 208 and through the aperture 213 to reduce frictional forces when opening and closing the lid assembly 104. The sleeve 211 may be fabricated from a material suitable such as an oil impregnated sintered bronze or the like.

Figure 7:
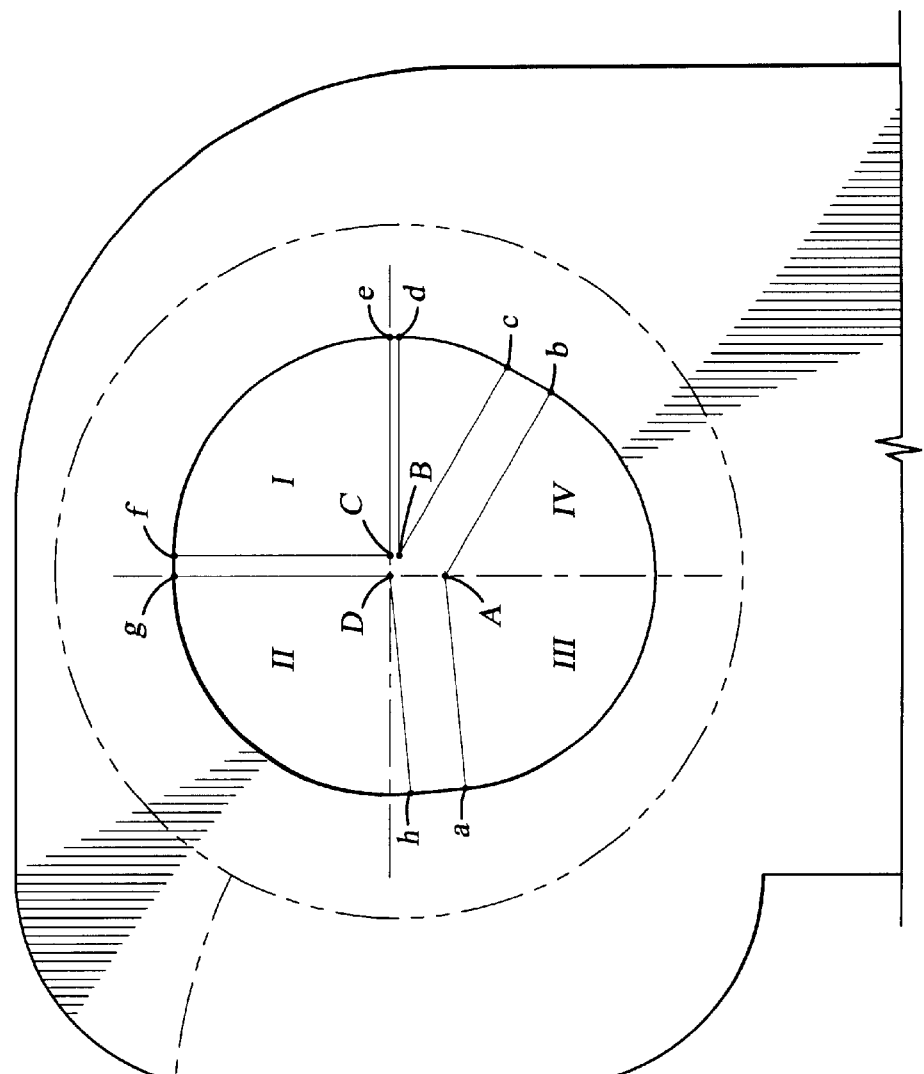
FIG. 7 depicts a detailed view of an aperture in the hinge block of FIG. 5.

The size and shape of the aperture 213 defines the translational movements of the lid assembly 104. A preferred embodiment of the aperture 213 is depicted in an enlarged cross-sectional view of FIG. 7. Specifically, the aperture 213 is shaped from a plurality of arc segments wherein each segment has a different origin. In particular, a first arc segment a-b is defined by a constant radius originating at point A. A second arc segment c-d is defined by a constant radius originating at point B. A third arc segment e-f is defined by a constant radius that originates at point C. A fourth arc segment g-h is defined by a constant radius that originates at point D. Circumscribing the aperture in a counterclockwise direction is a first substantially linear portion b-c, which couples the first arc segment a-b to the second arc segment c-d.

A second substantially linear portion d-e couples the second arc segment c-d to the third arc segment e-f. A third substantially linear portion f-g couples the third arc segment e-f to the fourth arc segment g-h, and finally, a fourth substantially linear portion h-a couples the fourth arc segment g-h to the first arc segment a-b. Furthermore, the aperture 213 may be viewed as comprising four quadrants. In general, the third and fourth quadrants III and IV have a radius greater than a radius of the first and second quadrants I an II as from the origin point D, which is generally the central point to the aperture. As such, translational movement of the shaft 208 is provided in a horizontal, as well as a vertical direction. Accordingly, the aperture 213 is a modified ellipse in shape. However, one skilled in the art will recognize that other shapes may be utilized. For example, such shapes may include oval shapes, kidney shapes, or any other constructed shapes or derivation thereof, as long as translation movement is provided in both the horizontal and vertical planes relative to the center of the shaft 208.

Referring to FIG. 2B, the cam plate 204 is generally fabricated from aluminum and is fastened to the lid assembly 104. Alternatively, the cam plate 204 may be an integral projection from one of the components of the lid assembly 104. The cam plate 204 has a hole 222 in which the shaft 208 is partially disposed. The shaft 208 is typically comprised of steel and retained in the hole 222 by a press fit.

The cam plate 204 has a contoured surface 216 that has a first portion 218 and a second portion 220. The first portion 218 is disposed inside the hinge block 202 and at a radial distance from the aperture 213 such that the center of rotation (i.e., a first inner pivot point) of the lid assembly 104 has a first range of motion from an open position, (shown in FIG. 2A) to nearly closed position about the shaft 208 and confined within the area defined by the aperture 213. When the second portion 220 of the contoured surface 216 makes contact with the cam follower 206, the lid assembly 104 moves from the nearly closed position to a closed position to define a second range of motion (i.e., through about 5 degrees relative the first surface 134). Accordingly, the center of rotation of the lid assembly 104 changes from the area defined by the aperture 213 inside the hinge block 202 (the first inner pivot position) to outside the hinge block 202, i.e., the center of the cam follower 206 to define a second outer pivot point. In other words, the second outer pivot point may be defined by the interaction between the cam plate 204 and the cam follower 206. To allow for the rotation of the lid assembly 104 about the cam follower 206, the aperture 213 is shaped (see FIG. 7) to allow the shaft 208 to move laterally in the aperture 213 (i.e., the shaft 208 rotates relative the cam follower 206).

A second hinge assembly (not shown) is disposed on the other side of the lid assembly 104. The second hinge assembly optionally, may not utilize a cam follower, thereby allowing the rotation of the lid assembly 104 to be defined by the first hinge assembly 170. The dual pivot action of the first hinge assembly 170 allows the lid assembly 104 to remain clear of the processing platform 120 using the first inner pivot point defined by the aperture 213. The second outer pivot point defined by the cam follower 206 seats the lid assembly 104 with a substantially normal motion relative the o-ring 138, thus minimizing abrasion and "pinching" of the o-ring 138 upon closing the lid assembly 104.

Figure 3:
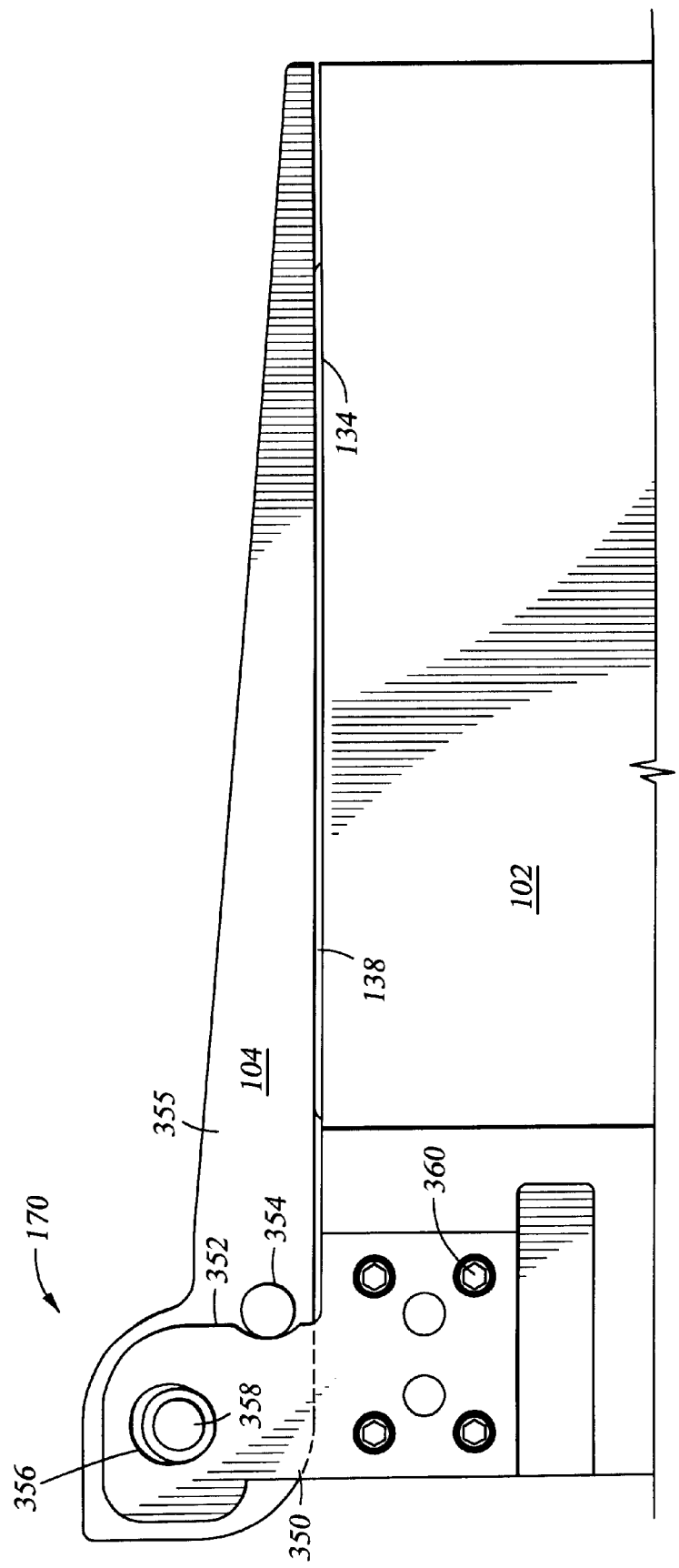
FIG. 3 depicts a cross-sectional view of a second embodiment of the hinge assembly.

Other embodiments of the first hinge assembly 170 include various derivations utilizing the dual pivot action of the preferred embodiment depicted in FIGS. 2A, 2B, 5, 6, and 7. FIG. 3 depicts a cross-sectional view of a second embodiment of the first hinge assembly 170. Specifically, a hinge block 350 is attached to the chamber body 102 and comprises a contoured edge 352 for interfacing with a cam follower 354 extending from a side 355 of a lid assembly 104. In this manner, the contoured edge 352 serves as a cam plate.

Furthermore, the hinge block 350 comprises an aperture 356 for receiving a shaft 358 coupled to the lid assembly a distance from the cam follower 354. A person skilled in the art will recognize that alternately, the lid assembly 104 may comprise an aperture (not shown) while the hinge block 350 comprises a shaft (not shown) extending into the aperture of the lid assembly 104. Therefore, the relationship between the aperture and shaft are simply reversed. In either of the embodiments, the aperture 356 is shaped larger than the shaft 358 thereby allowing for rotational and translational motion. Furthermore, the hinge block 350 may be an integral portion (not shown) of the first surface 134 of the chamber body 102 or attached via fasteners 360 (e.g., bolts) thereon.

In an instance where the lid assembly 104 is in a range that extends from an open position to a nearly closed position, a center of rotation (i.e., a first inner pivot point) of the lid assembly 104 exists. The first inner pivot point is formed inside the hinge block 350 about the shaft 358 and confined within the area defined by the aperture 356. Such operation is identified as a first range of motion for the lid assembly 104. When the lid assembly 104 moves from the nearly closed position to a fully closed position (defining a second range of motion i.e., through about 5 degrees relative the first surface 134), the contoured edge 352 makes contact with the cam follower 354. Accordingly, the center of rotation of the lid assembly 104 changes from inside the hinge block 350 in the area defined by the aperture 356 to outside the hinge block 350 at the center of the cam follower 354 (i.e., a second outer pivot point). Thus, in the fully closed position the lid assembly 104 closes substantially parallel to the first surface 134 of the chamber body 102, which thereby reduces the risk of crimping or tearing the o-ring 138 disposed on the first surface 134.

Figure 4:
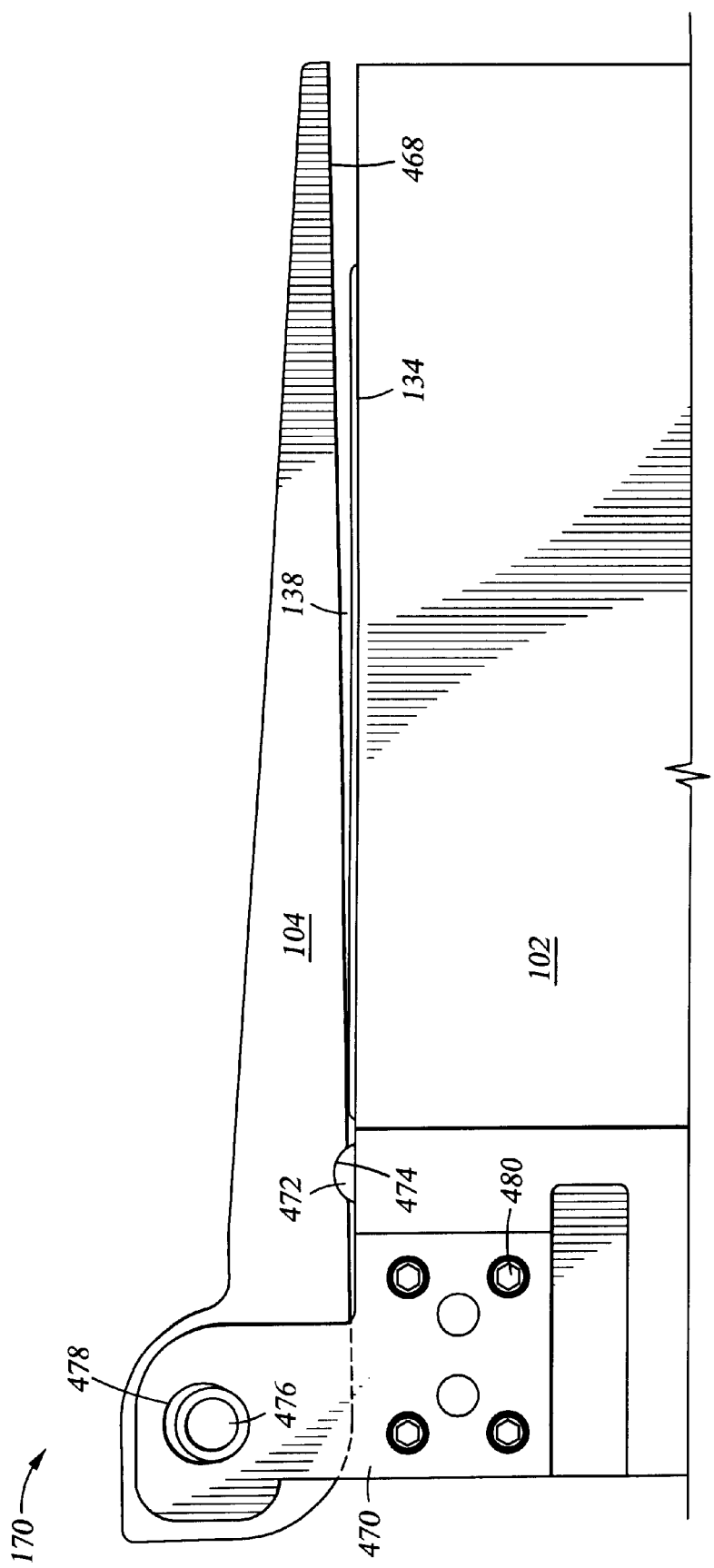
FIG. 4 depicts a cross-sectional view of a third embodiment of the hinge assembly.

FIG. 4 depicts a cross-sectional view of a third embodiment of the first hinge assembly 170, in which the cam plate 472 extends from the chamber body. Specifically, a first surface 134 of a chamber body comprises a projection 472 that functions as a cam plate. Additionally, a hinge block 470 is attached to the chamber body 102 and comprises an aperture 476 for receiving a shaft 478 coupled to a lid assembly 104. The aperture 476 is sized larger than the shaft 478 thereby allowing for rotational and translational motion. The lid assembly 104 further comprises a depression 474 (i.e., contoured surface area) on a lower surface area 468 of the lid assembly 104. The depression 474 interfaces with the cam plate 472 and thereby functions as a cam follower. The cam plate 472 is spaced at a predetermined distance from the shaft 478 of the lid assembly 104. Thus, in a similar manner as described in FIG. 3, in the fully closed position, the lid assembly 104 closes substantially parallel to the first surface 134 of the chamber body 102, which reduces the risk of crimping or tearing the o-ring 138 disposed on the first surface 134.

A person skilled in the art will recognize that the lid assembly 104 may comprise an aperture (not shown) while the hinge block 470 comprises a shaft (not shown) extending into the aperture of the lid assembly 104. In this manner, the relationship between the aperture and shaft are simply reversed. In either of the embodiments, the aperture 476 is shaped larger than the shaft 478 thereby allowing for rotational lateral motion. Furthermore, the hinge block 470 may be an integral portion (not shown) of the first surface 134 of the chamber body 102 or attached by fasteners 480 (e.g., bolts) thereon.

In an instance where the lid assembly 104 is in a range extending from open position to a nearly closed position, a center of rotation (i.e., a first inner pivot point) of the lid assembly 104 exists inside the hinge block 470 about the shaft 478 and confined within the area defined by the aperture 476. Such operation is identified as a first range of motion. When the lid assembly 104 moves from the nearly closed position to a closed position (shown, defining a second range of motion, i.e., through about 5 degrees relative the first surface 134), the contoured surface area 474 on the lower surface area 468 of the lid assembly 104 (i.e., cam follower 474) makes contact with the cam plate 472. Accordingly, the center of rotation of the lid assembly 104 changes from inside the hinge block 470 at the area defined by the aperture 476, to outside the hinge block 470 at the center of the cam follower 474 (i.e., a second outer pivot point).

Referring back to FIG. 1, the lid assembly 104 generally includes a lid 172, a dome 174 and a gas distribution ring 176.

The lid 172 is coupled the dome 174 and gas distribution ring 176. The lid 172 is typically fabricated from aluminum. The dome 174 is made of dielectric material that is transmissive to RF energy, for example, a ceramic such as aluminum oxide ($Al_2O_3$). Disposed above the dome 174 is a temperature control assembly (not shown) that is utilized to regulate the temperature of the dome 174 during the various process cycles, i.e., deposition cycle and cleaning cycle. Typically, the dome 174 is heated during cleaning cycles and cooled during processing. A temperature control assembly in a semiconductor wafer processing system is disclosed in U.S. patent application, Ser. No. 09/721,060, APPARATUS FOR CLEANING A SEMICONDUCTOR PROCESS CHAMBER, filed Nov. 21, 2000, and assigned to the same assignee as the present application, Applied Materials, Inc., of Santa Clara, Calif. This patent application is incorporated by reference as if fully reproduced herein.

The gas distribution ring 176 is disposed between the dome 174 and the chamber body 102. O-ring grooves 183 are formed in the top of the gas distribution ring 176 to receive an o-ring 185 to seal the dome 174 and the top of the gas distribution ring 176. The gas distribution ring 176 typically comprises a plurality of ports (not shown) formed therein for receiving nozzles 178 that are in communication the gas panel 108. The gas panel 108 may alternately be coupled to the chamber 106 via a showerhead or second nozzle 180 disposed beneath the dome 174. The gas panel 108 provides process and other gases to the chamber 106.

At least one antenna or coil 182 is wound external to the dielectric dome 174. The coil 182 is powered by a variable frequency RF power source 184. The RF power source 184 includes a RF matching network to transfer power to plasma generated in the processing region 128.

Opposite the first surface 134 of the chamber body 102 upon which the lid assembly 104 is disposed, is a second surface 135. Disposed centrally in the second surface 135 is the exhaust passage 130. The second surface 135 defines a generally flat landing area that abuts the pumping stack 118 that communicates with the exhaust passage 130.

The pumping stack 118 includes a throttle valve assembly 154, a gate valve 156 and a turbomolecular pump 158. The pumping stack 118 is mounted to the exhaust passage 130 of the chamber body 102 to provide pressure control within the system 100. Typically, the throttle valve assembly 154 is coupled to the chamber body 102, with the gate valve 156 disposed between the turbomolecular pump 158 and the throttle valve assembly 154. The throttle valve assembly 154 is mounted to the chamber body 102 via four mounting bolts 164, one of which is shown threaded into a threading mounting hole 162 disposed in the second surface 135 of the chamber body 102. A line 160 couples the turbomolecular pump 158 to a remote mainframe or roughing pump (not shown). The roughing pump evacuates the chamber 106 to a vacuum level within the operational range of the turbomolecular pump 158.

Although the teachings of the present invention that have been shown and described in detail herein, those skilled in the art can readily devise other varied embodiments that still incorporate the teachings and do not depart from the spirit of the invention.

What is claimed is:

1. A semiconductor substrate process chamber comprising:
   a chamber body;
   at least one hinge assembly having a first inner pivot point and a second outer pivot point;
   a lid coupled to said chamber body by said hinge assembly;
   a hinge block having an aperture, and extending from said chamber body;
   a cam plate having an outer surface, and coupled to said lid;
   a shaft disposed through said aperture of said hinge block and said cam plate; and
   a cam follower disposed on said chamber body and selectively interfacing with the outer surface of said cam plate.

2. The process chamber of claim 1, wherein the first inner pivot point is defined at an elevation above said chamber body.

3. The process chamber of claim 1, wherein the first inner pivot point is defined by said shaft at least partially disposed in said aperture of said hinge block.

4. The process chamber of claim 3, wherein the aperture is configured to permit the shaft to move rotationally and translationally.

5. The process chamber of claim 3, wherein the shaft is comprised of stainless steel.

6. The process chamber of claim 1, wherein the second outer pivot point is defined by said cam plate and said cam follower.

7. The process chamber of claim 6 wherein said cam follower is at least partially disposed in said hinge block.

8. The process chamber of claim 7, wherein the cam follower is cylindrical.

9. The process chamber of claim 7, wherein the cam follower is a roller bearing.

10. The process chamber of claim 6, wherein the cam follower is at least partially disposed in said chamber body.

11. The process chamber of claim 6, wherein the second outer pivot point is co-planar to a surface of said chamber body.

12. The process chamber of claim 6, wherein the outer surface of the cam plate further comprises:
    a first contoured surface; and
    a second contoured surface.

13. The process chamber of claim 12, wherein a center of rotation of the lid changes from the first inner pivot point to the second outer pivot point when the second contoured surface contacts said cam follower.

14. The process chamber of claim 13, wherein the second contoured surface contacts said cam follower when the lid is in a nearly closed position.

15. The process chamber of claim 14, wherein the nearly closed position is defined by the lid orientated about 0–5 degrees relative a top surface of the chamber body.

16. A semiconductor substrate process chamber comprising:
    a chamber body having a first surface;
    a lid movably disposed on said first surface, said lid having a first center of rotation relative said chamber body over a first range of motion and a second center of rotation relative said chamber over a second range of motion; and
    a cam plate having an outer surface that defines the second center of rotation.

17. The process chamber of claim 16 further comprising:
    a hinge block extending from said chamber body and having an aperture in a portion of said hinge block positioned beyond said first surface; and
    a shaft coupled to said lid and received by said aperture.

18. The process chamber of claim 17 where said shaft defines the first center of rotation and moves translationally in said aperture over said second range of motion.

19. The process chamber of claim 16 further comprising:
    a shaft coupled to said chamber body; and
    an aperture in said lid.

20. The process chamber of claim 19, where said shaft defines the first center of rotation and moves translationally in said aperture over said second range of motion.

21. The process chamber of claim 16, wherein said cam plate is coupled to said lid.

22. The process chamber of claim 16, wherein said cam plate extends from said chamber body.

23. The process chamber of claim 22, wherein said cam plate is a protrusion extending from a surface of the chamber body facing a lower surface area of said lid.

24. The process chamber of claim 22, wherein said cam plate is a contoured edge of said hinge block.

25. The process chamber of claim 16 further comprising:
   a cam follower that contacts said cam plate over said second range of motion.

26. The process chamber of claim 25, wherein said cam follower is coupled to said lid.

27. The process chamber of claim 26, wherein said cam follower is a contoured surface area on a lower surface area of the lid.

28. The process chamber of claim 26, wherein said cam follower extends from a side of said lid.

29. The process chamber of claim 25, wherein said cam follower is coupled to said chamber body.

30. The process chamber of claim 25, wherein said cam follower is a roller bearing.

31. A semiconductor substrate process chamber comprising:
   a chamber body;
   a lid movably disposed on said chamber body;
   at least one cam plate coupled to said lid, said cam plate having a first contoured surface and a second contoured surface;
   at least one hinge block coupled to said chamber body, said hinge block having an aperture;
   a cam follower coupled to said hinge block; and
   a shaft at least partially disposed in said aperture and coupled to said cam plate.

32. The process chamber of claim 31, wherein said shaft is configured to move translationally within said aperture.

33. The process chamber of claim 31, wherein said lid has a first center of rotation defined by said aperture and a second center of rotation defined by said second contoured surface and said cam follower.

* * * * *